(12) United States Patent
Iwai et al.

(10) Patent No.: US 8,218,682 B2
(45) Date of Patent: Jul. 10, 2012

(54) DIGITAL SIGNAL TRANSMITTING APPARATUS

(75) Inventors: Takashi Iwai, Ishikawa (JP); Daisuke Yamada, Kanagawa (JP)

(73) Assignee: Panasonic Corporation, Osaka (JP)

( * ) Notice: Subject to any disclaimer, the term of this patent is extended or adjusted under 35 U.S.C. 154(b) by 919 days.

(21) Appl. No.: 11/719,666

(22) PCT Filed: Nov. 17, 2005

(86) PCT No.: PCT/JP2005/021153
§ 371 (c)(1),
(2), (4) Date: May 18, 2007

(87) PCT Pub. No.: WO2006/054660
PCT Pub. Date: May 26, 2006

(65) Prior Publication Data
US 2009/0175377 A1    Jul. 9, 2009

(30) Foreign Application Priority Data
Nov. 22, 2004  (JP) .................................. 2004-337482

(51) Int. Cl.
*H03C 3/00*    (2006.01)
*H03K 7/06*    (2006.01)
*H04L 27/12*   (2006.01)
(52) U.S. Cl. ........................................ 375/302; 375/295
(58) Field of Classification Search ................... 375/302
See application file for complete search history.

(56) References Cited

U.S. PATENT DOCUMENTS

| 6,507,621 B2 | 1/2003 | Matsumoto et al. | |
| 6,876,637 B1 * | 4/2005 | Belaiche et al. | 370/329 |
| 7,072,416 B1 | 7/2006 | Sudo et al. | |
| 2002/0149496 A1 | 10/2002 | Dabak | |
| 2003/0171121 A1 * | 9/2003 | Kim et al. | 455/451 |
| 2004/0177311 A1 | 9/2004 | Marke | |
| 2004/0181618 A1 | 9/2004 | Dottling et al. | |
| 2004/0199846 A1 | 10/2004 | Matsumoto et al. | |
| 2004/0218684 A1 | 11/2004 | Golitschek Edler Von Elbwart et al. | |
| 2004/0254966 A1 * | 12/2004 | Sunwoo et al. | 708/200 |

(Continued)

FOREIGN PATENT DOCUMENTS

CN    1518810    8/2004

(Continued)

OTHER PUBLICATIONS

PCT International Search Report dated Jan. 31, 2006.

(Continued)

*Primary Examiner* — David C. Payne
*Assistant Examiner* — Erin File
(74) *Attorney, Agent, or Firm* — Dickinson Wright PLLC

(57) ABSTRACT

A digital signal transmitting apparatus that prevents occurrences of highness and lowness in error tolerance due to bit positions without raising the redundancy and without retransmittal. In the digital signal transmitting apparatus, a bit interchanging part (103) uses rate match information (105) to interchange bit positions such that a bit inserted by a rate match part (102) is placed at the bit position of a low error tolerance in a single symbol to be multilevel modulated. Moreover, the bit interchanging part (103) also uses the rate match information (105) to interchange bit positions such that another encoded bit, in which the bit punctured by the rate match part (102) is the same as the bit prior to encoding thereof, is placed at a bit position of a high error tolerance in a single symbol to be multilevel modulated.

8 Claims, 8 Drawing Sheets

U.S. PATENT DOCUMENTS

2006/0104374 A1 * 5/2006 Frederiksen et al. ......... 375/260

FOREIGN PATENT DOCUMENTS

| | | |
|---|---|---|
| JP | 2000201132 | 7/2000 |
| JP | 2001186023 | 7/2001 |
| JP | 2003209588 | 7/2003 |
| JP | 2003259441 | 9/2003 |
| JP | 2003309535 | 10/2003 |
| JP | 200423691 | 1/2004 |
| JP | 2004023691 | 1/2004 |
| JP | 2004531166 | 10/2004 |

OTHER PUBLICATIONS

Chinese Office Action dated Jul. 24, 2009 in a corresponding Chinese Patent Application.

* cited by examiner

DIGITAL SIGNAL TRANSMITTING APPARATUS

TECHNICAL FIELD

The present invention relates to a digital signal transmitting apparatus that is used in a digital wireless communication system. More particularly, the present invention relates to a digital signal transmitting apparatus that performs m-ary modulation of modulating three or more bits of transmission data into one symbol.

BACKGROUND ART

FIG. 1 is a block diagram showing an example of the configuration of a conventional digital signal transmitting apparatus which performs m-ary modulation of modulating three or more bits of transmission data to one symbol. Conventional digital signal transmitting apparatus 10 shown in FIG. 1 includes coder 11 to which transmission information data is inputted from outside, rate matching section 12 which receives the output of coder 11, and m-ary modulation section 13 which receives the output of rate matching section 12.

Coder 11 performs error correction coding, such as convolution coding or turbo coding, on information data to be transmitted and gives the result to rate matching section 12.

Rate matching section 12 performs rate matching processing on transmission data after error correction coding, to make the number of bits of the transmission data equal to a predetermined number of bits per radio frame on a physical channel, and gives the result to m-ary modulation section 13. Specifically, in the rate matching processing, when the number of bits of transmission data after error correction coding is less than the predetermined number of bits per radio frame on a physical channel, repetition processing is performed to repetitively insert bits in the bit sequence of the transmission data after error correction coding in a given cycle. When the number of bits of transmission data after error correction coding is greater than the predetermined number of bits, puncturing processing is performed to extract bits from the bit sequence of the transmission data after error correction coding in a given cycle.

M-ary modulation section 13 converts the error-corrected coded data after the rate matching processing, to a m-ary modulation signal having a plurality of bits modulated into one symbol. When the modulation scheme is 16 QAM (Quadrature Amplitude Modulation), for example, four bits are modulated into one symbol as shown in FIG. 2. FIG. 2 provides signal constellation diagrams on an IQ plane in 16 QAM. In 16 QAM, bits are placed on the IQ plane per four bits, as shown in FIG. 2.

Referring to the intercede distance of the bits in FIG. 2, the first and second bits are greater than the third and fourth bits. That is, the first and second bits have higher error robustness and the third and fourth bits have lower error robustness. Bits of higher error robustness will be referred to as upper bits and bits of lower error robustness will be referred to as lower bits. This means that, on the receiving side, error correction becomes difficult due to the influence of the lower bits, and, consequently, the reception performance deteriorates.

The digital signal transmitting apparatus with the configuration shown in FIG. 1 which directly performs m-ary modulation on the data sequence after rate matching processing has a problem that, as shown in FIG. 2, error robustness (likelihood of error, intercede distance, etc.) varies according to bit positions, and, consequently, the reception performance deteriorates.

One way of coping with the problem that error robustness varies according to bit positions is to perform error correction coding only on lower bits having lower error robustness, to improve the transmission rate while preventing degradation in error rate characteristics (Patent Document 1, for example). Another way is to perform m-ary modulation by mapping coded data of higher coding rate to upper bits of higher error robustness and mapping coded data of lower coding rate to lower bits of lower error robustness, based on the level of error robustness according to bit positions (Patent Document 2, for example). Still another way is to switch upper bits and lower bits upon every retransmission and equalize error robustness according to bit positions after packet combining and improve error rate characteristics (Patent Document 3, for example).

Patent Document 1: Japanese Patent Application Laid-Open No. 2001-186023
Patent Document 2: Japanese Patent Application Laid-Open No. 2004-23691
Patent Document 3: Japanese Patent Application Laid-Open No. 2003-309535

DISCLOSURE OF INVENTION

Problems to be Solved by the Invention

However, with the conventional solutions, the redundancy of error correction needs to be increased in order to improve reception performance, which then derives the problem of lowered information transmission rate.

The method of rearranging the bit positions upon every retransmission has the problem that it demonstrates little effect in one transmission but proves effective over a plurality of times of retransmissions.

It is therefore an object of the present invention to provide a digital signal transmitting apparatus capable of preventing error robustness from increasing or decreasing according to bit positions, without increasing redundancy, and without retransmission.

Means for Solving the Problem

In accordance with one aspect of the present invention, the digital signal transmitting apparatus of the present invention employs a configuration having: a rate matching section that performs rate matching processing of converting a coded transmission data sequence to a transmission data sequence comprising a predetermined number of bits; a bit rearranging section that rearranges an order of bit arrangement in the transmission data sequence after the rate matching processing, using position information of a bit repetitively inserted or a bit repetitively punctured in the rate matching processing; and a m-ary modulation section that performs m-ary modulation of the transmission data after the bit rearrangement in a unit of a plurality of bits comprising minimum three bits.

In accordance with one aspect of the present invention, the digital signal transmitting apparatus of the present invention employs a configuration having: a bit position error robustness calculating section that calculates error robustness according to a bit position in m-ary modulation; a rate matching section that performs rate matching processing of converting a coded transmission data sequence to a transmission data sequence comprising a predetermined number of bits, using the error robustness according to the bit position; and a m-ary modulation section that performs m-ary modulation of the transmission data after the rate matching processing in a unit of a plurality of bits comprising minimum three bits.

Advantageous Effect of the Invention

The present invention can prevent error robustness from increasing or decreasing according to bit positions and improve reception performance, without increasing redundancy and without retransmission, by rearranging the order of bit arrangement of the transmission data sequence after rate matching processing or by performing rate matching processing using error robustness according to bit positions in m-ary modulation.

BEST MODE FOR CARRYING OUT THE PRESENT INVENTION

Embodiments of the present invention will be described in detail with reference to the accompanying drawings.

(Embodiment 1)

Figure 1:
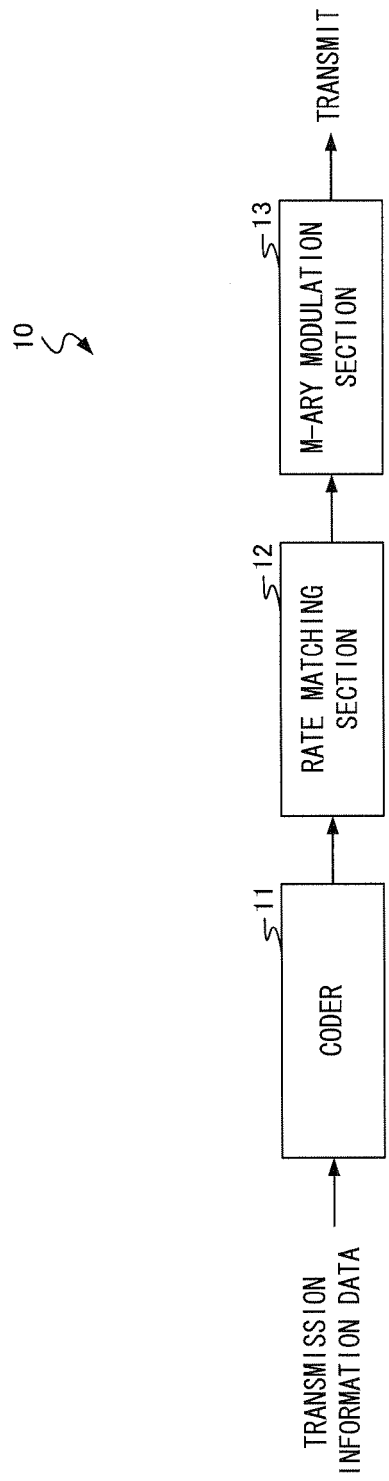
FIG. 1 is a block diagram showing an example of the configuration of the conventional digital signal transmitting apparatus.
Figure 2:
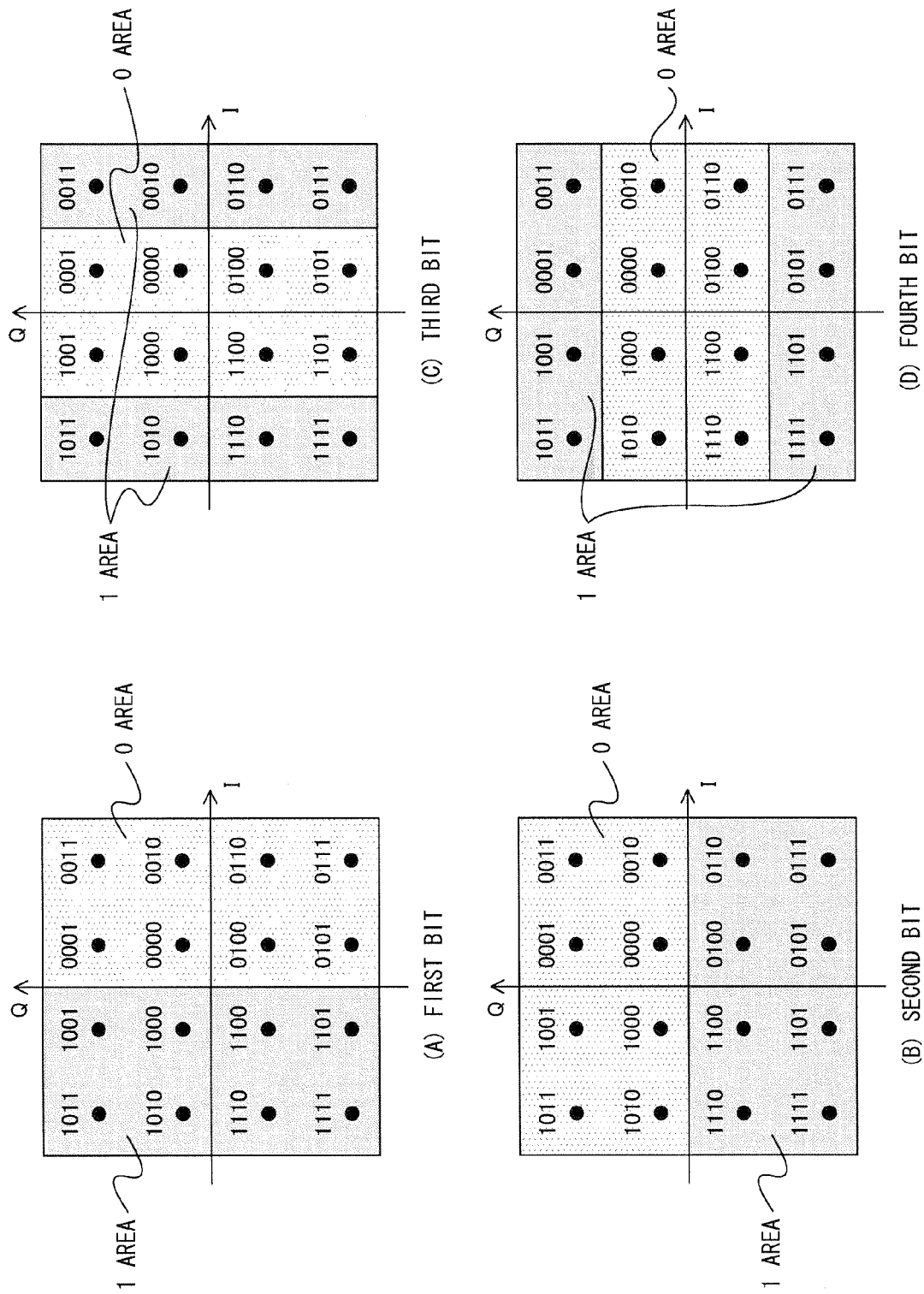
FIG. 2 is a diagram illustrating the relationship between bit positions and error robustness in m-ary modulation.
Figure 3:
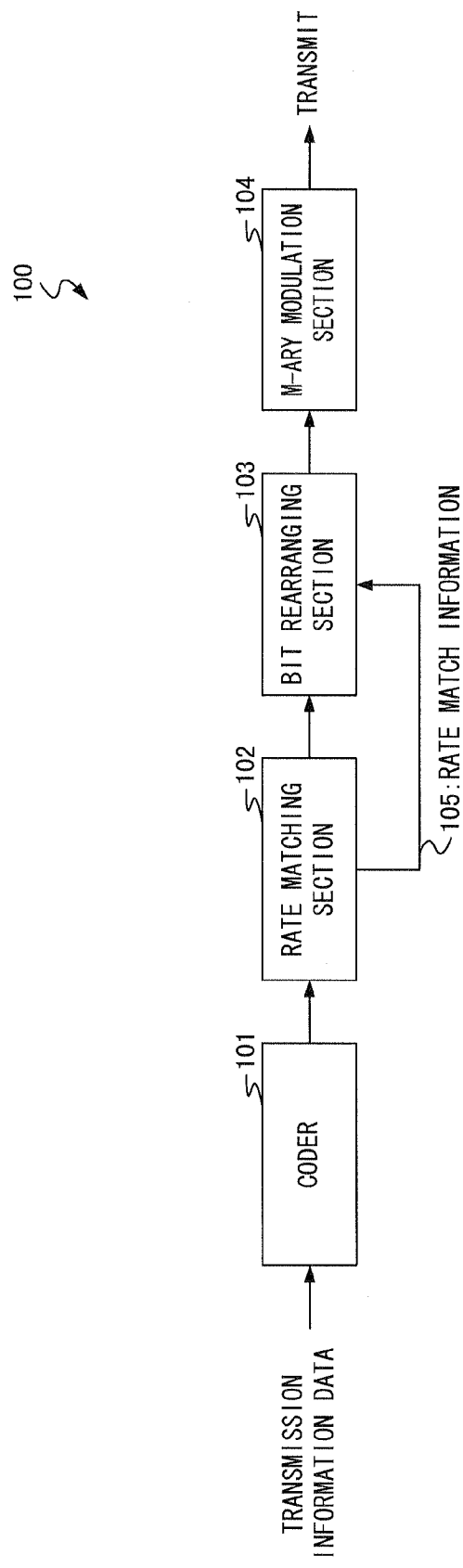
FIG. 3 is a block diagram showing the configuration of a digital signal transmitting apparatus according to embodiment 1 of the present invention.

FIG. 3 is a block diagram showing the configuration of a digital signal transmitting apparatus according to embodiment 1 of the present invention. Digital signal transmitting apparatus 100 according to embodiment 1 shown in FIG. 3 includes coder 101 to which transmission information data is inputted from outside, rate matching section 102 which receives the output of coder 101, bit rearranging section 103 which receives the output of rate matching section 102, and m-ary modulation section 104 which receives the output of bit rearranging section 103.

Coder 101 performs error correction coding, such as convolutional coding or turbo coding, on information data to be transmitted and gives the result to rate matching section 102.

Rate matching section 102 performs rate matching processing of repetitively inserting bits into the bit sequence of error-corrected coded transmission data in a given cycle (repetition processing) or extracting bits from the bit sequence of error-corrected coded transmission data in a given cycle (puncturing processing), such that the number of bits of the error-corrected coded transmission data is equal to a predetermined number of bits per radio frame on a physical channel, and gives the result to bit rearranging section 103.

At this time, rate matching section 102 gives rate match information 105 which is position information of the bits repetitively inserted or extracted (punctured) in the rate matching processing, to bit rearranging section 103.

When the rate matching processing is repetition processing, bit rearranging section 103 performs the processing of rearranging the order of bit arrangement in the data sequence after the rate matching processing, using rate match information 105, such that the bit positions indicated by rate match information 105 takes lower bit positions of lower error robustness in a symbol to be subjected to m-ary modulation, and outputs the result to m-ary modulation section 104.

When the rate matching processing rate matching processing is puncturing processing, bit rearranging section 103 performs the processing of rearranging the order of bit arrangement in the data sequence after the rate matching processing, using rate match information 105, such that coded bits that derive from the same original bit, with the bit of the bit position indicated in rate match information 105, take upper bit positions of higher error robustness in a symbol subject to m-ary modulation, and sends the result to m-ary modulation section 104.

M-ary modulation section 104 converts error-corrected coded data outputted from bit rearranging section 103 to a m-ary modulation signal having a plurality of bits modulated into one symbol. When the modulation scheme is 16 QAM, for example, four bits are modulated into one symbol. The following description will be given with this modulation example.

Figure 4:
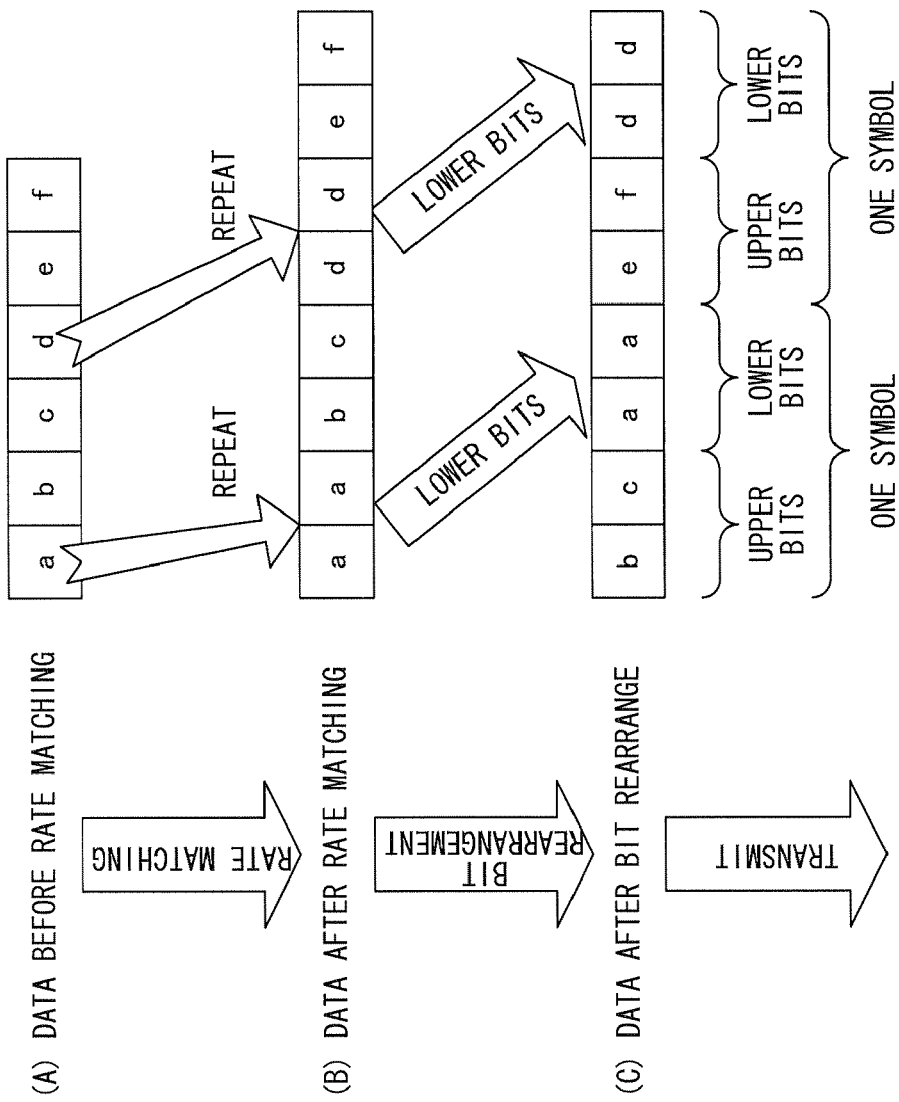
FIG. 4 is a diagram illustrating the operation on the transmitting side when the rate matching section shown in FIG. 3 performs repetition processing.
Figure 5:
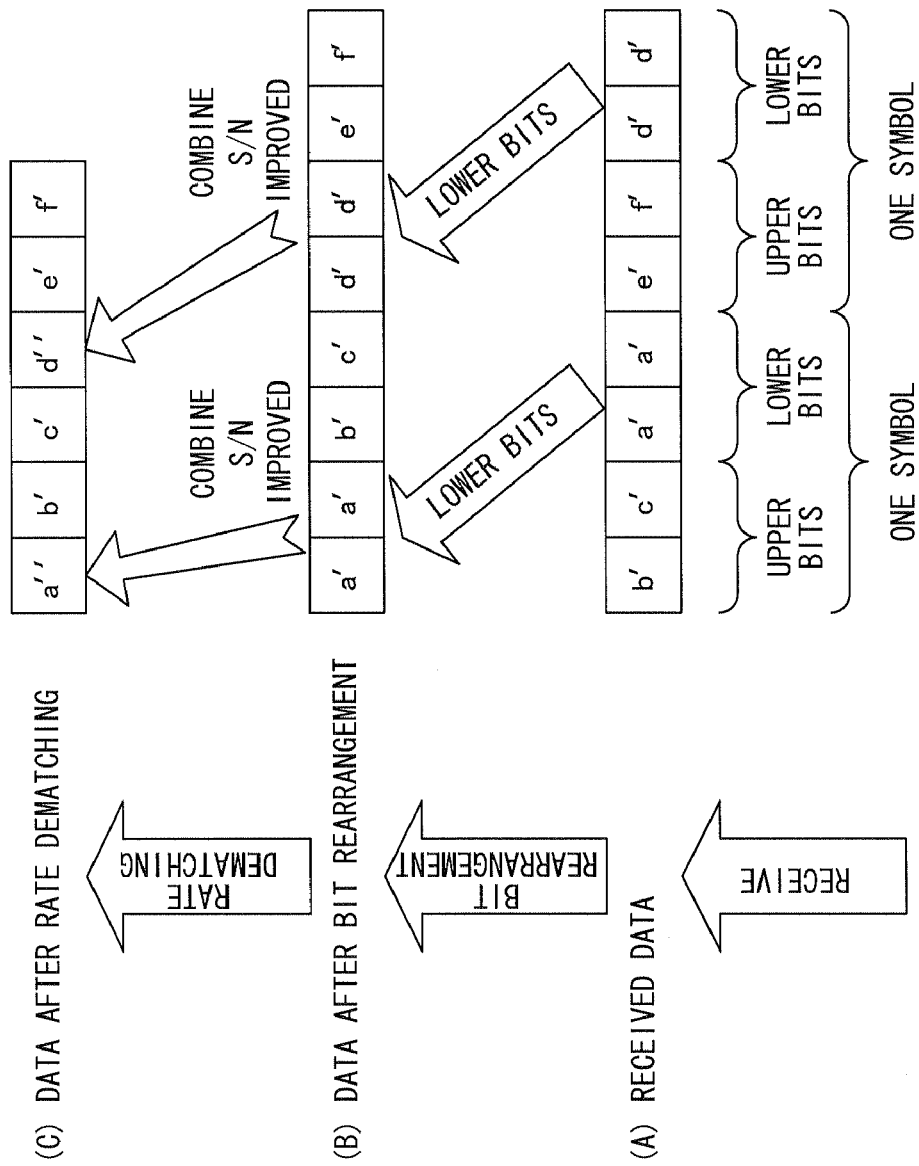
FIG. 5 is a diagram illustrating the operation on the receiving side when the rate matching section shown in FIG. 3 performs repetition processing.
Figure 6:
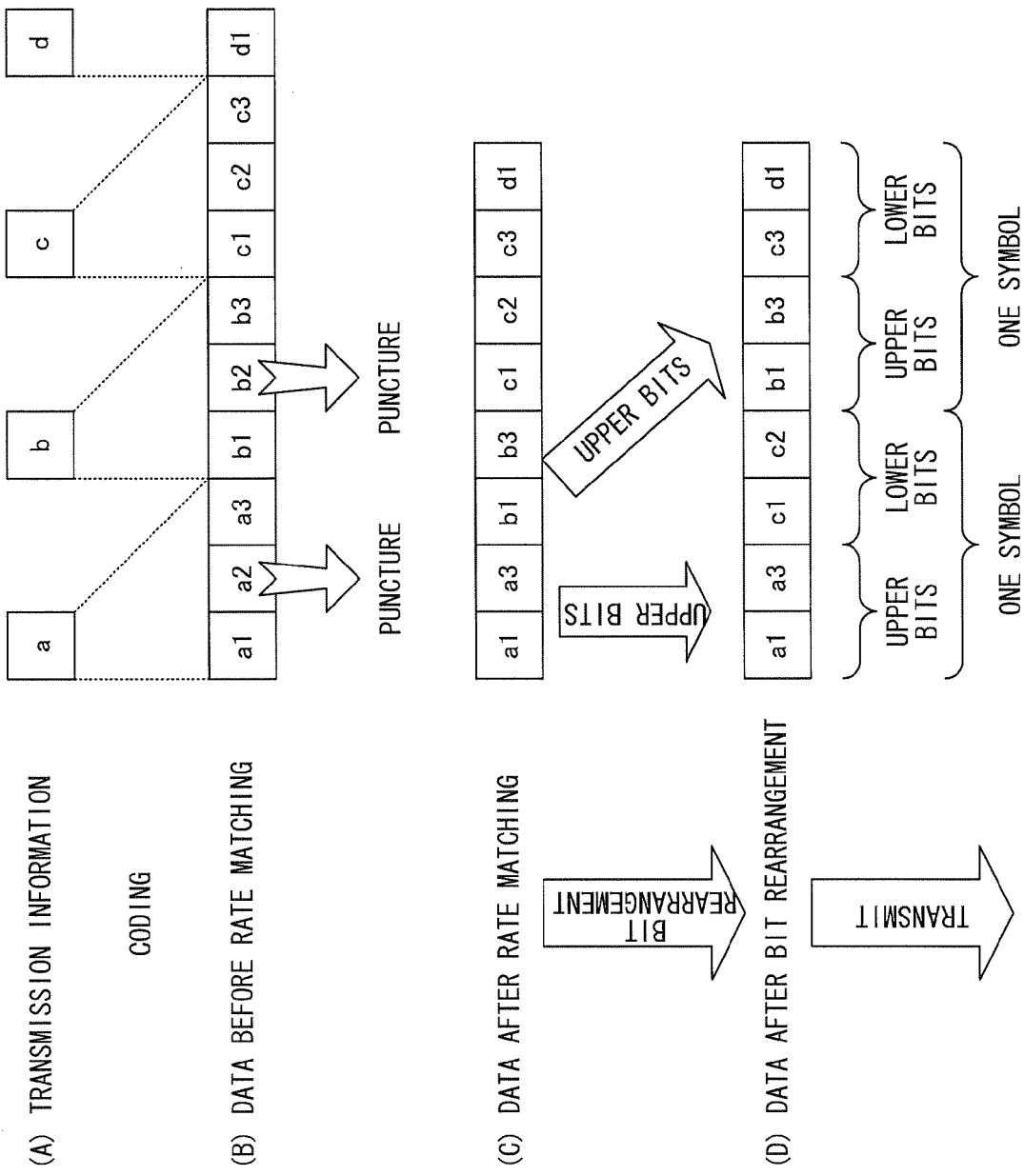
FIG. 6 is a diagram illustrating the operation on the transmitting side when the rate matching section shown in FIG. 3 performs puncturing processing.
Figure 7:
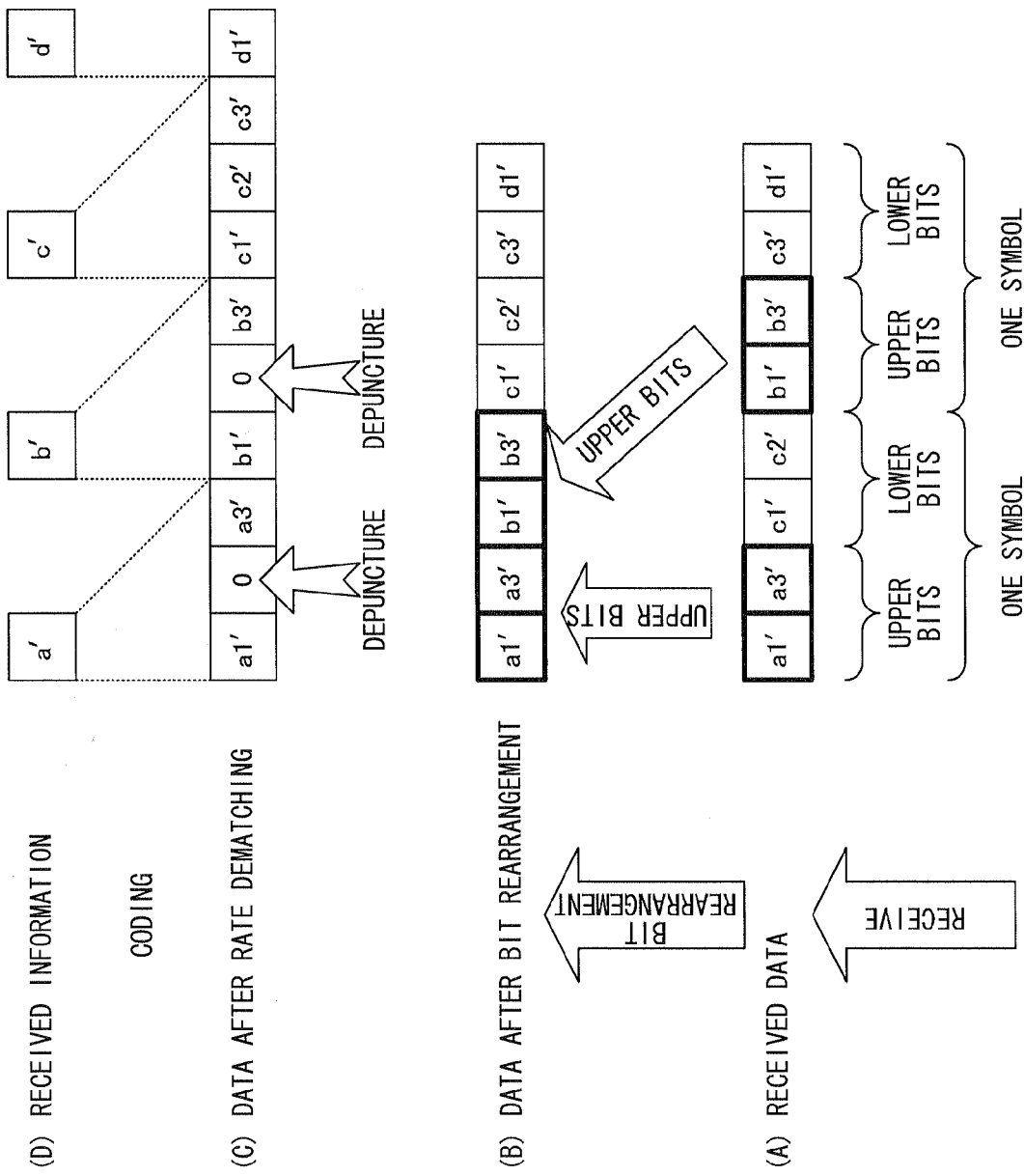
FIG. 7 is a diagram illustrating the operation on the receiving side when the rate matching section shown in FIG. 3 performs puncturing processing.

Referring to FIG. 4, FIG. 5, FIG. 6 and FIG. 7, the data transmission operation of the digital signal transmitting apparatus configured as above will be explained. FIG. 4 and FIG. 5 illustrate the operations on the transmitting side and the receiving side when the rate matching processing is repetition processing. FIG. 6 and FIG. 7 illustrate the operations of the transmitting side and the receiving side when the rate matching processing is puncturing processing.

(1) The transmission/reception operations when the rate matching processing is repetition processing, are performed as follows. As shown in FIG. 4, on the transmitting side, (A) when data before the rate matching processing (repetition processing) is "abcdef," after (B) the rate matching processing (repetition processing), bits "a" and "d" are repetitively inserted so that the data after the rate matching processing (repetition processing) becomes "aabcddef."

Of the first four bits "aabc" in the data "aabcddef" after the rate matching processing (repetition processing), "aa" are the upper bits and "bc" are the lower bits. Of the following four bits "ddef," "dd" are the upper bits and "ef" are the lower bits. In this data form of "aabcddef," the bits "bc" and "ef," which are not subject to repetition processing, are placed at lower bit positions of lower error robustness in a symbol subject to m-ary modulation, in m-ary modulation section 104.

In (C) bit rearrangement processing, therefore, the bits "aa" and "dd" subjected to repetition processing are placed at lower bit positions of lower error robustness in a symbol subject to m-ary modulation, in m-ary modulation section 104. As a result, the data after bit rearrangement becomes "bcaaefdd." M-ary modulation section 104 modulates the first four bits "bcaa" and the following four bits "efdd" by 16 QAM scheme.

In FIG. 5, on the receiving side: (A) received data "b'c'a'a'e'f'd'd'" by soft decision is acquired; (B) bit rearrangement is performed with this received data "b'c'a'a'e'f'd'd'" in reverse steps to those performed on the transmitting side, to set the data arrangement back to "a'a'b'c'd'd'e'f'"; and (C) afterwards, rate dematching processing is performed to combine the repeated data "a'a'" and "d'd'" with the regained data "a'a'b'c'd'd'e'f'" to acquire single pieces of data "a" and "d", yielding data "a''b'c'd''e'f'" to be decoded.

When the repetition processing is performed as rate matching processing, as apparent from the above, even if repetitively inserted bits are placed at lower bit positions of lower error robustness before transmission, on the receiving side, S/N is improved through the rate dematching processing (data combining) so that it is possible to improve error robustness. In other words, this prevents error robustness from increasing or decreasing according to bit positions. Accordingly, the error rate characteristics of received information data obtained by performing error correction decoding on the data after rate dematching, improve.

(2) The transmission/reception operations when the rate matching processing is puncturing processing, are performed as follows. As shown in FIG. 6, on the transmitting side, (A) transmission information "a," "b," "c" and "d" are subjected to error correction coding. Now, assume that (B) data before rate matching processing (puncturing processing) is comprised of "a1, a2, a3" resulting from error correction coding of "a," "b1, b2, b3" resulting from error correction coding of "b," "c1, c2, c3" resulting from error correction coding of "c," and "d1, ... " resulting from error correction coding of "d."

(C) In the rate matching processing (puncturing processing), the bit "a2" is extracted (punctured) from the error-corrected coded data "a1, a2, a3," the bit "b2" is extracted (punctured) from the error-corrected coded data "b1, b2, b3," and no puncturing processing is performed on the error-corrected coded "c1, c2, c3" and "d1, .... " Data after the rate matching processing (puncturing processing) becomes "a1, a3, b1, b3, c1, c2, c3, d1, .... "

Of the data "a1, a3, b1, b3, c1, c2, c3, d1 ... " after the rate matching processing (puncturing processing), the four bits "a1, a3, b1, b3," "c1, c2, c3, d1, ... " are each a symbol subject to m-ary modulation. In this case, the four bits "a1, a3, b1, b3" are coded data relating to the original data "a" and "b" subjected to puncturing processing, but, the coded data bits "b1, b3" of the original data "b" are placed at lower bit positions of lower error robustness, and this should be avoided.

(D) In the bit rearrangement processing, coded bits that derive from the same original bit, with the punctured bit, are placed as upper bits of higher error robustness in a symbol subject to m-ary modulation. That is, in the bit rearrangement processing, for the processing of forming four bits subject to m-ary modulation, from the data after the rate matching processing (puncturing processing) "a1, a3, b1, b3, c1, c2, c3, d1 ... ," coded bits "a1, a3," which derive from the same original bit, with the punctured bit "a2," are placed as upper bits of higher error robustness, thereby forming "a1, a3, c1, c2." In addition, coded bits "b1, b3," which derive from the same original bit, with the punctured bit "b2," are placed as upper bits of higher error robustness, thereby forming "b1, b3, c3, d1."

As shown in FIG. 7, the receiving side involves the following: (A) received data "a1', a3', c1', c2', b1', b3', c3', d1'" by soft decision is acquired; (B) this received data "a1', a3', c1', c2', b1', b3', c3', d1'" is rearranged in reverse steps to the steps performed on the transmitting side, to resume the original data arrangement "a1', a3', b1', b3', c1', c2', c3', d1'"; (C) afterwards, rate dematching processing of inserting (depuncturing) values (e.g., "0") that do not influence the decoding, in the positions of the punctured bits in the regained data "a1', a3', b1', b3', c1', c2', c3', d1'," yielding data "a1, 0, a3', b1', 0, b3', c1', c2', c3', d1'" to be decoded; and (D) as a result, received information "a'" is restored from the data "a1', 0, a3'" to be decoded, and received information "b'" is restored from the data "b1', 0, b3'" to be decoded.

In other words, when puncturing processing is performed as rate matching processing, even when data to be used in decoding is reduced by puncturing, another coded data is placed at upper bit position of higher error robustness and the data is transmitted, so that it is possible to prevent deterioration of reception performance.

According to embodiment 1, bits that are repetitively inserted in the data sequence after rate matching are placed at lower bit positions of lower error robustness in a symbol subject to m-ary modulation, and coded bits that derive from the same original bit, with the punctured bit in the data sequence after rate matching, are placed at upper bit positions of higher error robustness in a symbol subject to m-ary modulation, so that it is possible to prevent error robustness from increasing and decreasing according to bit positions, without increasing redundancy, without retransmission.

(Embodiment 2)

Figure 8:
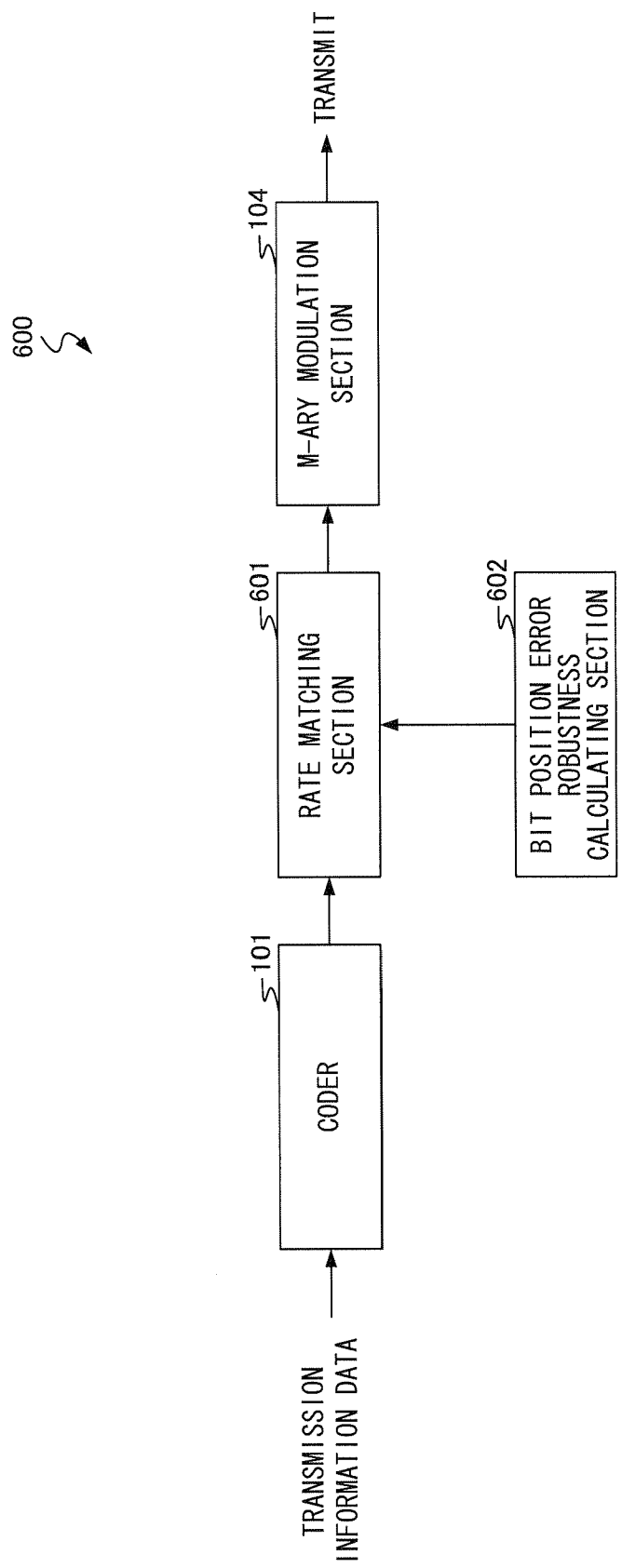
FIG. 8 is a block diagram showing the configuration of a digital signal transmitting apparatus according to embodiment 2 of the present invention.

FIG. 8 is a block diagram showing the configuration of a digital signal transmitting apparatus according to embodiment 2 of the present invention. In FIG. 8, the same reference symbols are used for those components identical or similar to the components shown in FIG. 3 (embodiment 1). The following will mainly describe parts that relate to embodiment 2.

As shown in FIG. 8, in digital signal transmitting apparatus 600 according to embodiment 2, bit rearranging section 103 shown in FIG. 3 is removed, rate matching section 601 is provided in place of rate matching section 102, and bit position error robustness calculating section 602 is added.

Bit position error robustness calculating section 602 calculates error robustness according to bit positions in m-ary modulation, and gives bit position error robustness information indicating the calculation results to rate matching section 601.

Rate matching section 601 performs repetition processing of repetitively inserting bits or puncturing processing of repetitively extracting bits using the bit position error robustness information, in consideration of increase and decrease of error robustness according to bit positions in m-ary modulation.

In case of repetition processing, rate matching section 601 performs rate matching processing such that the repetitively inserted bits are placed at lower bit positions of lower error robustness. In case of puncturing processing, rate matching section 601 performs rate matching processing such that coded bits that derive from the same original bit, with the repetitively punctured bits, are placed as upper bits of higher error robustness.

According to embodiment 2, as apparent from the above, rate matching processing is performed in consideration of the level of error robustness according bit positions in m-ary modulation, so that, similar to embodiment 1, it is possible to prevent error robustness from increasing and decreasing according to bit positions, without increasing redundancy, without retransmission, and improve reception performance.

The present application is based on Japanese Patent Application No. 2004-337482, filed on Nov. 22, 2004, the entire content of which is expressly incorporated by reference herein.

Industrial Applicability

The present invention is suitable for use in a digital signal transmitting apparatus for a digital wireless communication system.

The invention claimed is:

1. A digital signal transmitting apparatus comprising:
a rate matcher that generates a transmission data sequence comprising a coded data sequence and a repeated bit from the coded data sequence;
a bit rearranger that rearranges a bit order of the transmission data sequence such that the repeated bit is arranged at a lower error robustness bit position than other bit positions within an m-ary modulation symbol; and
an m-ary modulator that modulates at least three bits, including the repeated bit, of the bit-rearranged transmission data sequence into the m-ary modulation symbol.

2. A digital signal transmitting apparatus comprising:
a bit position error robustness calculator that calculates error robustness according to a bit position in m-ary modulation;
a rate matcher that generates a transmission data sequence comprising a coded data sequence and a repeated bit from the coded data sequence; and
an m-ary modulator that modulates at least three bits, including the repeated bit, of the transmission data sequence into an m-ary modulation symbol, wherein:
the rate matcher generates the transmission data sequence by arranging a bit order of the transmission data sequence such that the repeated bit is arranged at a lower error robustness bit position than other bit positions within the m-ary modulation symbol.

3. A digital signal transmitting apparatus comprising:
a rate matcher that performs rate matching processing by extracting, from a coded transmission data sequence, a first part of coded bits obtained by coding an unencoded bit so as to produce a rate-matched data sequence;
a bit rearranger that rearranges a bit order of the rate-matched data sequence such that a second part of the coded bits obtained by coding the unencoded bit is arranged at a higher error robustness bit position than other bit positions within an m-ary modulation symbol; and
an m-ary modulator that modulates at least three bits including the second part of the coded bits, of the rate-matched data sequence into the m-ary modulation symbol.

4. A digital signal transmitting apparatus comprising:
a bit position error robustness calculator that calculates error robustness according to a bit position in m-ary modulation;
a rate matcher that performs rate matching processing by extracting, from a coded transmission data sequence, a first part of coded bits obtained by coding an unencoded bit so as to produce a rate-matched data sequence; and
an m-ary modulator that modulates at least three bits, including a second part of the coded bits obtained by coding the unencoded bit, of the rate-matched data sequence into an m-ary modulation symbol, wherein:
the rate matcher generates the transmission data sequence by arranging a bit order of the rate-matched data sequence such that the second part of the coded bits is arranged at a higher error robustness bit position than other bit positions within the m-ary modulation symbol.

5. A digital signal transmitting method, performed by a processor, comprising:
generating, by the processor, a transmission data sequence comprising a coded data sequence and a repeated bit from the coded data sequence;
rearranging, by the processor, a bit order of the transmission data sequence such that the repeated bit is arranged at a lower error robustness bit position than other bit positions within an m-ary modulation symbol; and
modulating, by the processor, at least three bits, including the repeated bit, of the bit-rearranged transmission data sequence into the m-ary modulation symbol.

6. A digital signal transmitting method, performed by a processor, comprising:
calculating, by the processor, error robustness according to a bit position in m-ary modulation;
generating, by the processor, a transmission data sequence comprising a coded data sequence and a repeated bit from the coded data sequence, by arranging the bit order of the transmission data sequence such that the repeated bit is arranged at a lower error robustness bit position than other bit positions within an m-ary modulation symbol; and
modulating, by the processor, at least three bits, including the repeated bit, of the transmission data sequence into the m-ary modulation symbol.

7. A digital signal transmitting method, performed by a processor, comprising:
performing, by the processor, rate matching processing by extracting, from a coded transmission data sequence, a first part of coded bits obtained by coding an unencoded bit so as to produce a rate matched data sequence;
rearranging, by the processor, a bit order of the rate-matched data sequence such that a second part of the coded bits obtained by coding the unencoded bit is arranged at a higher error robustness bit position than other bit positions within an m-ary modulation symbol; and
modulating, by the processor, at least three bits, including the second part of the coded bits, of the bit rearranged rate-matched data sequence into the m-ary modulation symbol.

8. A digital signal transmitting method, performed by a processor, comprising:
calculating, by the processor, error robustness according to a bit position in m-ary modulation;
performing, by the processor, rate matching processing by extracting, from a coded transmission data sequence, a first part of coded bits obtained by coding an unencoded bit so as to produce a rate-matched data sequence, and by arranging the bit order of the transmission data sequence such that a second part of the coded bits is arranged at a higher error robustness bit position than other bit positions within an m-ary modulation symbol; and
modulating, by the processor, at least three bits, including the second part of the coded bits obtained by coding the unencoded bit, of the rate-matched data sequence into the m-ary modulation symbol.

* * * * *